(12) United States Patent
Ubale

(10) Patent No.: US 9,769,550 B2
(45) Date of Patent: Sep. 19, 2017

(54) EFFICIENT DIGITAL MICROPHONE RECEIVER PROCESS AND SYSTEM

(71) Applicant: NVIDIA Corporation, Santa Clara, CA (US)

(72) Inventor: Anil Ubale, Cupertino, CA (US)

(73) Assignee: Nvidia Corporation, Santa Clara, CA (US)

( * ) Notice: Subject to any disclaimer, the term of this patent is extended or adjusted under 35 U.S.C. 154(b) by 772 days.

(21) Appl. No.: 14/073,652

(22) Filed: Nov. 6, 2013

(65) Prior Publication Data

US 2015/0127333 A1    May 7, 2015

(51) Int. Cl.
*H03H 17/02* (2006.01)
*H04R 1/00* (2006.01)

(52) U.S. Cl.
CPC ......... *H04R 1/005* (2013.01); *H03H 17/0282* (2013.01); *H04R 2201/003* (2013.01); *H04R 2499/11* (2013.01)

(58) Field of Classification Search
CPC .......... H04R 2201/003; H04R 2499/11; H03H 17/0282; H03H 17/0664
USPC ................... 381/122; 332/106, 109; 708/313
See application file for complete search history.

(56) References Cited

U.S. PATENT DOCUMENTS

| | | | |
|---|---|---|---|
| 5,012,519 A | 4/1991 | Adlersberg et al. | |
| 8,521,530 B1 | 8/2013 | Every et al. | |
| 8,892,450 B2 | 11/2014 | Schildbach et al. | |
| 8,990,073 B2 | 3/2015 | Malenovsky et al. | |
| 9,454,975 B2 | 9/2016 | Ubale | |
| 2003/0101052 A1 | 5/2003 | Chen et al. | |
| 2009/0259672 A1 | 10/2009 | Garudadri et al. | |
| 2009/0259922 A1 | 10/2009 | Garudadri et al. | |
| 2009/0309774 A1 | 12/2009 | Hamashita | |
| 2010/0322441 A1 | 12/2010 | Weiss et al. | |
| 2011/0235813 A1 | 9/2011 | Gauger, Jr. | |
| 2011/0291584 A1 | 12/2011 | Filippo et al. | |
| 2012/0124603 A1 | 5/2012 | Amada | |
| 2012/0155703 A1 | 6/2012 | Hernandez-Abrego et al. | |
| 2014/0006825 A1 | 1/2014 | Shenhav | |
| 2014/0132304 A1* | 5/2014 | Haiut | H04R 3/005 326/52 |
| 2014/0229184 A1 | 8/2014 | Shires | |
| 2014/0244253 A1 | 8/2014 | Bringert et al. | |
| 2014/0278393 A1 | 9/2014 | Ivanov et al. | |
| 2014/0281628 A1 | 9/2014 | Nigam et al. | |
| 2014/0337016 A1 | 11/2014 | Herbig et al. | |
| 2014/0358552 A1 | 12/2014 | Xu | |
| 2015/0106089 A1 | 4/2015 | Parker et al. | |
| 2015/0127335 A1* | 5/2015 | Ubale | G10L 25/78 704/231 |

U.S. PATENT DOCUMENTS

| | | |
|---|---|---|
| 2015/0205342 A1 | 7/2015 | Ooi |
| 2015/0245154 A1 | 8/2015 | Dadu et al. |

* cited by examiner

*Primary Examiner* — Matthew Sandifer

(57) ABSTRACT

A method for processing a bitstream starts by shifting a bitstream of a first sample of a signal into a buffer. The buffer also holds bits of one or more additional bitstreams for one or more additional samples of the signal. Bits of a first half of the buffer are incrementally compared to corresponding bits of a second half of the buffer. Each bit of the first half of the buffer is compared to a corresponding bit of the second half of the buffer. A computation is performed on each bit of the first half of the buffer that is equal to a corresponding bit of the second half of the buffer. The results of the computations are summed to determine an output value for the first sample of the signal.

20 Claims, 14 Drawing Sheets

PDM digital microphone signals and spectra for -10 dBFS 1 kHz tone with an OSR = 64.

Sinc5 Differentiator Architecture

Figure 8 Sinc5 Polynomial Coefficients for OSR = 256.

EFFICIENT DIGITAL MICROPHONE RECEIVER PROCESS AND SYSTEM

TECHNICAL FIELD

The present disclosure relates generally to the field of digital microphones and more specifically to the field of receiving one-bit pulse density modulated audio signals.

BACKGROUND

Recently, the popularity of mobile communications consumer devices (e.g., smart phones and tablet devices) has soared. These devices may typically encounter harsh acoustic noise environments due to their mobile nature (e.g., in cars, traffic, and street noise). The non-stationary nature of the acoustic noise demands that these devices utilize improved microphones. For example, multiple microphones may be used for noise cancellation and/or microphone arrays for beam steering.

There is also a growing trend towards ultra-thin form factors, and sleek and light-weight industrial designs, as evidenced by the popularity of the latest generations of smart phones and tablet devices. In addition, there is also pressure to reduce the bill-of-materials (BOM) cost for these devices by reducing their number of components and reducing the printed circuit board (PCB) space.

Digital micro electro-mechanical systems (MEMS) microphones have been found to meet many of these requirements described above. The digital MEMS microphones are replacing analog microphones in mobile handsets and tablet devices, and may replace the analog microphone in other technologies as well.

Digital microphones may also produce a one-bit pulse density modulated (PDM) digital output. A digital microphone capable of producing a one-bit PDM digital output takes individual samples (e.g., 8 or 12 bits worth of information) of a sound pressure wave received by the microphone and directly converts each of them into a PDM data stream of 1's and 0's. For example, each sample may be converted into a bitstream with a selected number of bits as determined by a selected oversampling ratio (OSR), such that a sample rate*OSR=the number of bits in a bitstream for each sample. A PDM data stream of all 0's would represent a maximum negative amplitude, a PDM data stream of all 1's would represent a maximum positive amplitude, and a PDM data stream of alternating 1's and 0's would represent a zero amplitude.

Smartphone and tablet platforms may also utilize more than one digital microphone. Voice communication may be signal channel and can be carried out with a single microphone voice capture in an ambient noise-free environment. However, increasingly, the consumer usage of these mobile devices is carried out in noisy environments. In order to maintain a high-quality of conversation, typical a microphone array of two to four microphones may be employed. In some platforms, the audio capture for a camcorder recording may also be performed using four microphones. In addition, many platforms are also using current-sense and voltage-sense feedback signals from the speaker for speaker protection. The current sense and voltage sense feedback signals may also be transported back in PDM format. Thus, it is quite common to have as many as eight digital microphones, or PDM signals received by a processor in a mobile device. For example, four digital microphones for noise-cancellation in voice communication, two digital microphones placed close to the camera for a camcorder, and two additional PDM signals for speaker protection feedback. In the future, it is possible that this need will increase.

Obviously, as the number of channels increases, the amount of die-area needed for storing the accumulator state for each PDM receiver grows linearly. For example, for a single microphone, 40 bytes of storage (5*8) may be needed, with the amount increasing to 320 bytes for eight microphones. In addition, if the a same compute engine (MAC) is used across all eight microphones (in order to save area), it requires 6*8*OSR or a 590 MHz clock for a 48 kHz sample rate. On the other hand, if the number of MAC units is increased, the area for the computational logic grows linearly.

SUMMARY OF THE INVENTION

Embodiments of this present invention provide a solution to the challenges inherent in processing one-bit pulse density modulated audio signals from one or more digital microphones. In a method according to one embodiment of the present invention, a method for processing a bitstream representing a sample of an audio stream is disclosed. In one embodiment a first pulse density modulated (PDM) bitstream of a first sample of an audio signal is shifted into a bit buffer. The bit buffer also holds bits of four additional PDM 1-bit bitstreams for four additional samples of the audio signal. Bits of a first half of the bit buffer are incrementally compared to corresponding bits of a second half of the bit buffer, such that each bit of the first half of the bit buffer is compared to a corresponding bit of the second half of the bit buffer. A computation is performed on each bit of the first half of the bit buffer that is equal to a corresponding bit of the second half of the bit buffer. The results of the computations are summed to determine an output value for the first sample of the audio signal.

In an apparatus according to one embodiment of the present invention, an audio system is disclosed. The audio system comprises a plurality of buffers each operable to hold bitstreams of a plurality of samples of corresponding audio signals, a coefficient generator operable to incrementally generate a plurality of coefficients, a plurality of comparators each coupled to a corresponding buffer, and a plurality of summation modules each coupled to the coefficient generator and a corresponding comparator of the plurality of comparators, and each operable to receive and sum a currently generated coefficient of the plurality of coefficients with a running sum of coefficients when an enable signal is received from the corresponding comparator. A first buffer holds bitstreams of a plurality of samples of a first audio signal. The comparators are each operable to incrementally compare bits of a first half of a corresponding buffer to corresponding bits of a second half of the corresponding buffer and output an enable signal when a bit of the first half of the corresponding buffer is equal to a corresponding bit of the second half of the corresponding buffer. Each summed plurality of coefficients is an output value for a sample of a corresponding audio signal.

BRIEF DESCRIPTION OF THE DRAWINGS

The present invention will be better understood from the following detailed description, taken in conjunction with the accompanying drawing figures in which like reference characters designate like elements and in which.

DETAILED DESCRIPTION

Figure 1:
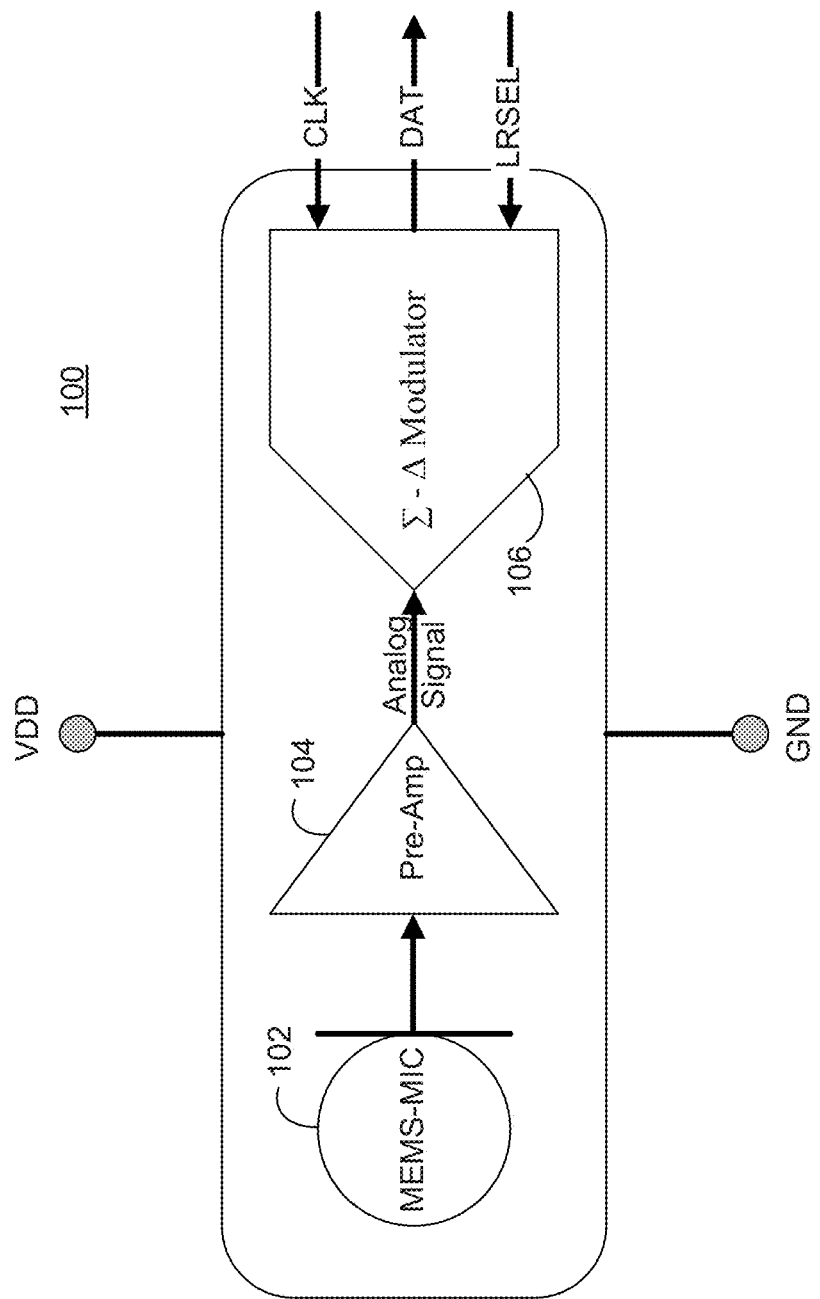
FIG. 1 illustrates an exemplary block diagram of a digital microphone incorporating pulse density modulation in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Embodiments of this present invention provide a solution to the challenges inherent in processing one-bit pulse density modulated digital signals from one or more digital microphones. Various embodiments of the present disclosure provide a process for increasing the efficiency of processing the one-bit pulse density modulated digital signal. In one embodiment, bits of a first half of a bit buffer are incrementally compared to corresponding bits of a second half of the bit buffer, such that each bit of the first half of the bit buffer is compared to a corresponding bit of the second half of the bit buffer. In one embodiment the bit buffer comprises a bitstream of a first sample of an audio signal and four additional PDM 1-bit bitstreams for four additional samples of the audio signal. As discussed herein, a computation is performed on each bit of the first half of the bit buffer that is equal to a corresponding bit of the second half of the bit buffer. The results of the computations are summed to determine an output value for the first sample of the audio signal.

Digital Microphones Providing a 1-Bit Pulse Density Modulated Digital Signal:

Table 1 below compares analog and digital microphones, illustrating many of the advantages of digital microphones. As illustrated in Table 1, digital microphones, as compared to analog microphones, have high noise immunity to nearby noise sources (e.g., LCD screens and Wi-Fi antennas). Digital microphones also provide close-matching amplitude and phase sensitivity, as compared to analog microphones. Lastly, digital microphones may be manufactured with significant PCB area savings as compared to analog microphones.

TABLE 1

A Comparison of Analog and Digital Microphones

| Feature | Description | Analog Microphones | Digital Microphones |
|---|---|---|---|
| RF/EM noise immunity | High noise immunity is essential for thin designs since the microphone wires are typically laid out next to noise sources LCD screen, Wi-Fi antenna etc. | Difficult to achieve high noise immunity without painstakingly careful analog interface design. | PDM one-bit digital output is robust to RF/EM noise coupling. |
| Microphone array | Matching in amplitude and phase sensitivity of microphones is required for microphone arrays. | Close-matching not possible. Requires per-device calibration for microphone mismatch during array signal processing. | Close-matching of microphone amplitude and phase sensitivity. |
| External components | Need to reduce component count for compact form-factor and BOM cost. | Each input supports one microphone with DC blocking capacitor needed for each input. | Direct interface. Significant PCB area savings for multi-microphone designs. |

In one exemplary embodiment, a digital microphone produces a one-bit pulse density modulated digital signal. As discussed herein, pulse density modulation may be used to convert an analog signal to a digital signal. The relative density of digital pulses (1, 0) is used to encode the amplitude of the analog signal. As the received analog signal is sampled, each analog sample is represented with a bitstream. For example, a bitstream of all 1s would represent an analog signal sample with a maximum amplitude, while a bitstream of all 0s would represent an that analog signal sample with a minimum amplitude. A bitstream of alternating 1s and 0s would represent an analog signal sample with 0 volt amplitude. In one embodiment, an analog signal may be represented by a string of bitstreams, one bitstream for each corresponding analog signal sample. Therefore, an arrangement of 1s and 0s (from a continuous string of bitstreams) may be used to represent an analog signal where the density of 1s and 0s is used to represent a changing amplitude of the analog signal (e.g., the analog signal is at a maximum when the density of 1s has peaked, and at a minimum when the density of 0s has peaked), and a rate of repetition of a density pattern may be used to represent a frequency of the analog signal.

FIG. 1 illustrates an exemplary digital microphone. In one embodiment, pulse density modulation incorporates sigma-delta modulation. An exemplary digital microphone may use a fourth-order noise transfer function for the sigma-delta modulation and a one-bit quantizer. The digital microphone 100 illustrated in FIG. 1 comprises a MEMS microphone 102, a pre-amp 104, and a sigma-delta modulator 106. As also illustrated in FIG. 1, the digital microphone 100 is connected to VCC and GND. Further, the sigma-delta modulator 106 receives a clock signal (CLK) and a left, right selection signal (LRSEL). As illustrated in FIG. 1, in one embodiment, the analog audio signal is converted into a 1-bit pulse density modulated bitstream.

In one embodiment, the CLK signal provides the digital microphone 100 with an oversampled clock at a rate of OSR*FS clocks per second, where OSR is an oversampling ratio (e.g., 64, 128, and 256), and FS is an audio recording sampling rate. The digital microphone 100 drives a one-bit pulse density modulated (PDM) output signal on the DAT line. In one embodiment, the PDM output data on the DAT line is output on rising or falling edges of the incoming clock (CLK) signal, depending on the polarity of the LRSEL signal. Thus, the same CLK signal and DAT line may be shared between left and right microphones for dual-microphone systems.

Figure 2:
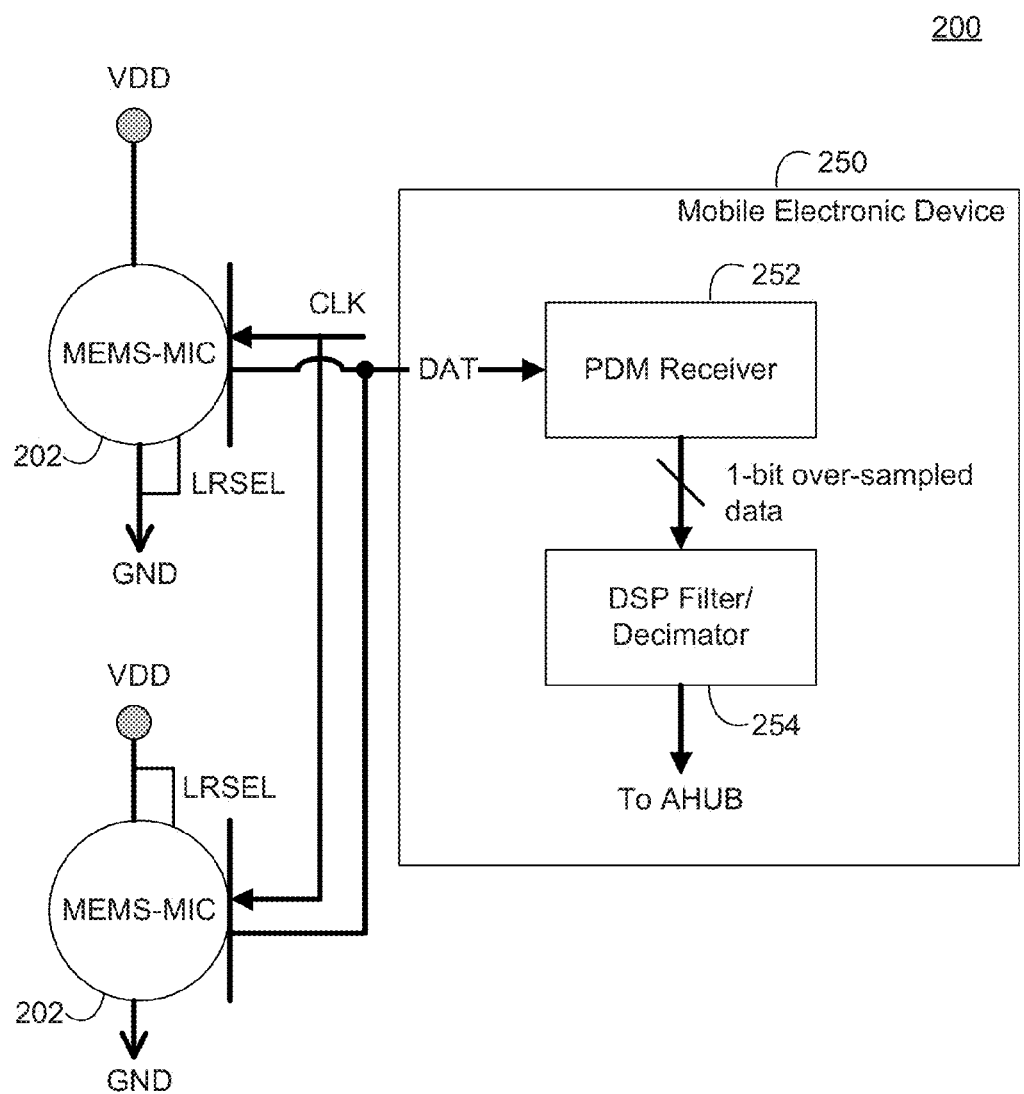
FIG. 2 illustrates an exemplary block diagram of a digital microphone receiver interface in accordance with an embodiment of the present invention.

FIG. 2 illustrates an exemplary dual-microphone system 200. The dual microphone system 200 comprises a pair of microphones 202, and a shared CLK signal and a shared DAT line. As further illustrated in FIG. 2, the PDM output data from the microphones 202 is carried on the DAT line to a PDM receiver 252 of an exemplary device 250 (e.g., a smart phone, cell phone, and tablet device). FIG. 2 also illustrates that the PDM receiver 252 transmits a 1-bit over-sampled data stream to a DSP filter/decimator 254 for eventual transmission to an AHUB.

An exemplary sigma-delta modulation may achieve high-SNR digitization of an analog signal via oversampling and noise shaping. When an input signal is oversampled and quantized using a uniform quantizer, a total quantization noise variance (e.g., $q^2/12$, where q is a quantization step size) is the same, but the same noise power may then be spread over a larger frequency range (equal to the original frequency range*OSR). Therefore, an SNR in the frequency range of interest may be improved by OSR times (e.g., if OSR=64, then the SNR may be improved by 64 times). Thus, every doubling of the oversampling ratio (OSR) improves the SNR by 3 dB. With a further incorporation of noise-shaping in the sigma-delta modulation, the quantization noise may be shaped such that a quantization noise power spectral density in the frequency range of interest may be reduced further. For example, first-order sigma-delta modulation may theoretically improve the SNR by 9 dB for each doubling of the oversampling ratio. Second-order sigma-delta modulation can theoretically improve the SNR by 15 dB for each doubling of the oversampling ratio (OSR).

Most digital microphones typically use fourth-order sigma-delta modulation and one-bit quantization.

The digital microphone (DMIC) receiver interface to a mobile communications device (smart phone or table device, etc.) may comprise digital signal processing of a signal received on a DAT signal input line to the mobile electronic device. As illustrated in FIG. 2, an exemplary DMIC receiver consists of a PDM receiver 252 which samples the DAT signal at a correct sampling instant during a half-clock cycle to detect a one-bit left and right channel PDM sample. The one-bit oversampled PDM samples are processed by a low-pass filter to filter out the high-frequency noise from the PDM oversampled signal and retain the signal in the frequency range of interest. The filtered signal is then decimated down by an OSR factor to obtain a received 16-, 20-, or 24-bit audio signal.

Figure 3A:
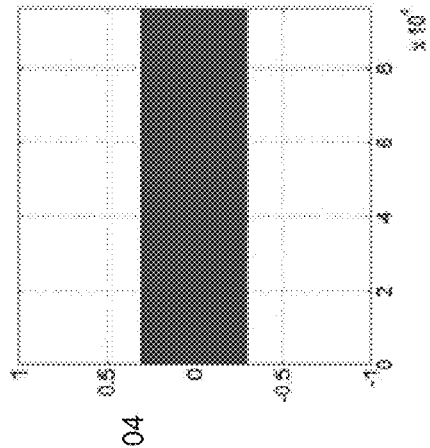
FIGS. 3A, 3B, 3C, 3D, 3E, and 3F illustrate exemplary pulse density modulated digital microphone signals and spectra for an exemplary digital microphone receiver in accordance with an embodiment of the present invention.

Signal Processing of Audio Signals by an Exemplary Digital Microphone Receiver:

FIGS. 3A, 3B, 3C, 3D, 3E, and 3F illustrate exemplary pulse density modulated digital microphone signals and spectra for an exemplary digital microphone receiver. As discussed herein, FIGS. 3A, 3B, 3C, 3D, 3E, and 3F illustrate an exemplary pulse density modulation, and how oversampling and quantization noise shaping may affect a digital microphone's output signal and its spectrum. As illustrated in FIG. 3A, an input acoustic signal is an exemplary 1 kHz tone with a sound pressure level that is −10 dB below an overload amplitude with no background noise. An exemplary analog signal at the input to the sigma-delta modulator 106 in the digital microphone 100 is a −10 dBFS 1 kHz tone, where dBFS is a quantity of decibels relative to full scale, where a value of 0 dBFS is assigned to a maximum possible digital level. An exemplary audio recording sample rate is 48 kHz and an exemplary oversampling ratio (OSR) is 64.

Figure 3C:
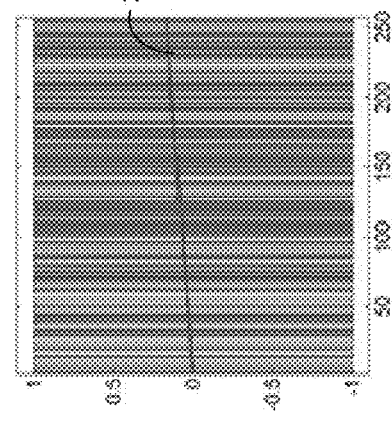
Figure 3E:
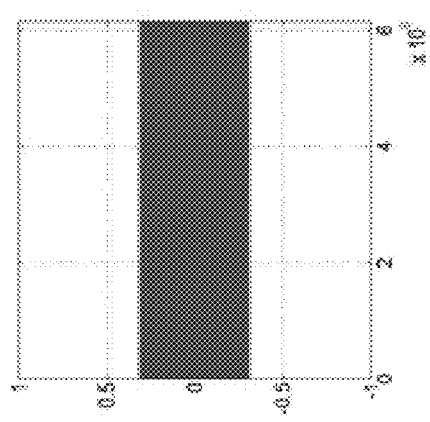
Figure 3B:
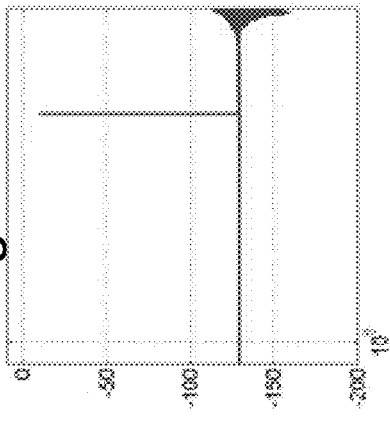

A corresponding signal spectrum is illustrated in FIG. 3B. An exemplary one-bit pulse density modulated signal at the output of the sigma-delta modulator 106 is illustrated in FIG. 3C. An exemplary analog signal 304 is superimposed on the PDM signal for illustration for a first 256 samples. In one embodiment, as the input signal 304 becomes more positive, a density of is in the PDM output signal increases. Similarly, as the input signal 304 becomes more negative, a density of 0s (a digital 0 is represented as −1 in the graph) in the PDM output signal increases. Since the input signal 304 is close to zero for the first 256 samples, the pulse density has an approximately equal number of is and 0s (represented as +1 and −1, respectively).

Figure 3D:
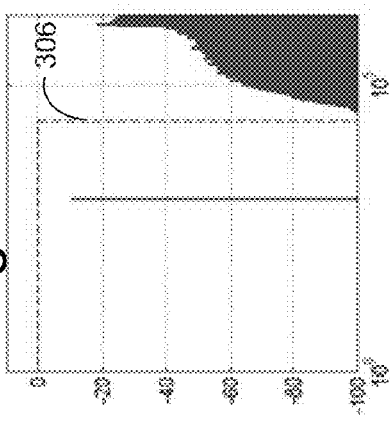
Figure 3F:
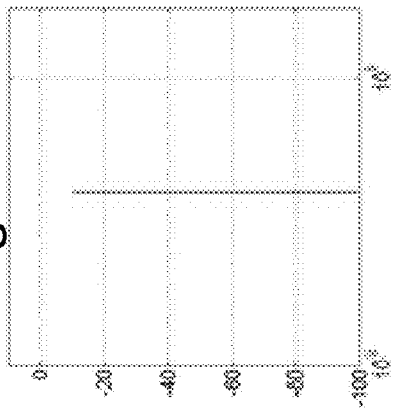

FIG. 3D illustrates a frequency spectrum of the PDM output signal for the entire signal duration. An x-axis of FIG. 3D represents frequency in a logarithmic scale, while a y-axis represents an amplitude of the signal and noise spectrum. An exemplary dashed boundary 306 illustrates an exemplary frequency range of interest (0-24 kHz), while an exemplary oversampled PDM signal spectrum range is from 0-3.072 MHz due to 64 oversampling (OSR=64). FIG. 3E illustrates an exemplary filtered and decimated signal at the output of the digital microphone receiver 100. The received signal is very close to the original signal. FIG. 3F illustrates a frequency spectrum of the received signal and illustrates an exemplary high signal to noise ratio (SNR).

An exemplary ideal DPS filter has a magnitude frequency response that is the same as the dashed line 306 illustrated in FIG. 3D. However, this narrow and sharp brick-wall type of response is unrealizable and non-causal (a filter that's output depends on future events). Instead, an exemplary filter which approximates the ideal frequency response may be used. Note that the filter's pass-band and transition band is very narrow. This implies that if a finite impulse response (FIR) filter is used, its order will be large. A large-order FIR filter will require a large amount of computations and also a large amount of memory storage for storing filter coefficients. This is especially true since the exemplary DSP filter operates at the oversampled rate, so for each output sample there are OSR×N computations to be performed, where N is an order of the FIR filter.

An exemplary infinite impulse response (IIR) filter may solve the problems of large computations as well as large coefficient storage. However, an IIR filter with a sharp frequency response may lead to non-linear phase distortion in the output audio signal. A popular and commonly used DSP filter for a PDM receiver is a sinc decimation filter. An exemplary sinc decimation filter of order N is often denoted as a sincN decimation filter and is defined by the following transfer function:

$$H(z) = \frac{1}{OSR}\left(\frac{1-Z^{-OSR}}{1-Z^1}\right)^N.$$

Figure 4:
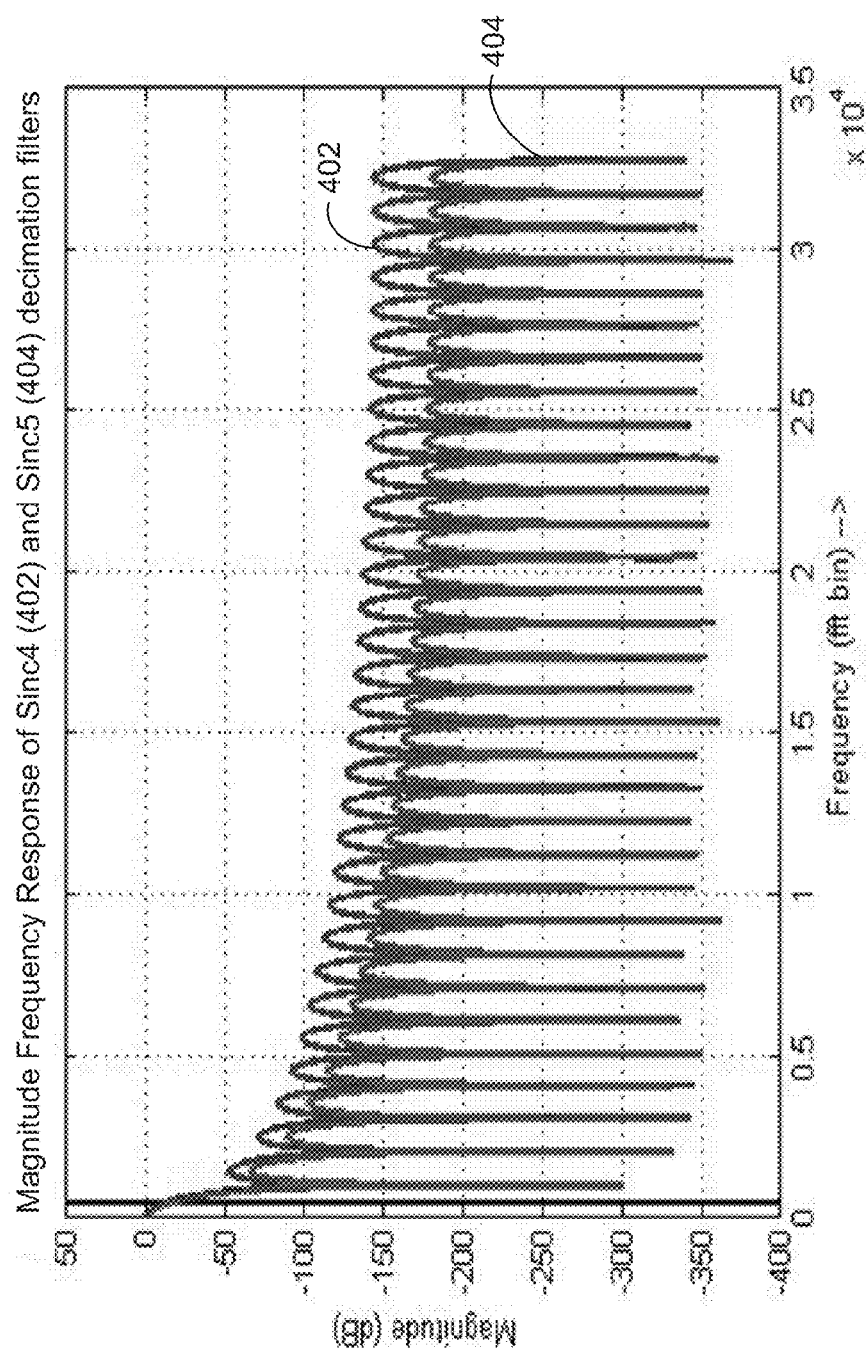
FIG. 4 illustrates exemplary magnitude frequency responses of exemplary sinc decimation filters in accordance with an embodiment of the present invention.

FIG. 4 illustrates exemplary magnitude frequency responses for exemplary sinc4 (402) and sinc5 (404) decimation filters, when OSR=64. As a sinc decimation filter order is increased, a top-band attenuation increases when a roll-off in the pass-band also increases. An advantage of a sinc decimation filter is that it does not require coefficient storage and requires very few computations per oversampled input sample. Typically, a sinc5 decimation filter meets SNR and dynamic range requirements for digital microphone receivers.

Figure 5:
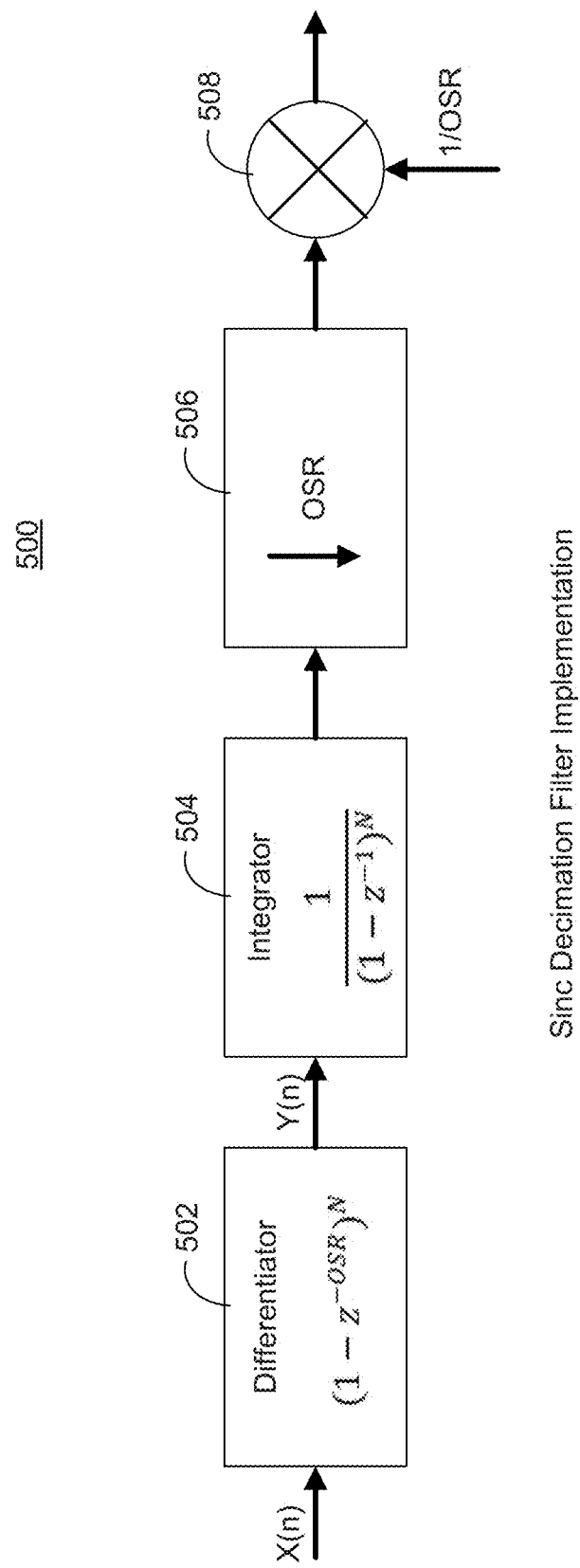
FIG. 5 illustrates an exemplary block diagram of a sinc decimation filter in accordance with an embodiment of the present invention.

Sinc Decimation Filter Implementation:

FIG. 5 illustrates one implementation of a sinc decimation filter 500. The sinc decimation filter 500 illustrated in FIG. 5 comprises a differentiator 502, an integrator 504, a decimator 506, and a multiplier module 508. In one exemplary embodiment, the decimator 506 may perform decimation by OSR. This exemplary implementation may require OSR*2N computations per output sample for an Nth order sinc decimation filter.

Figure 6:
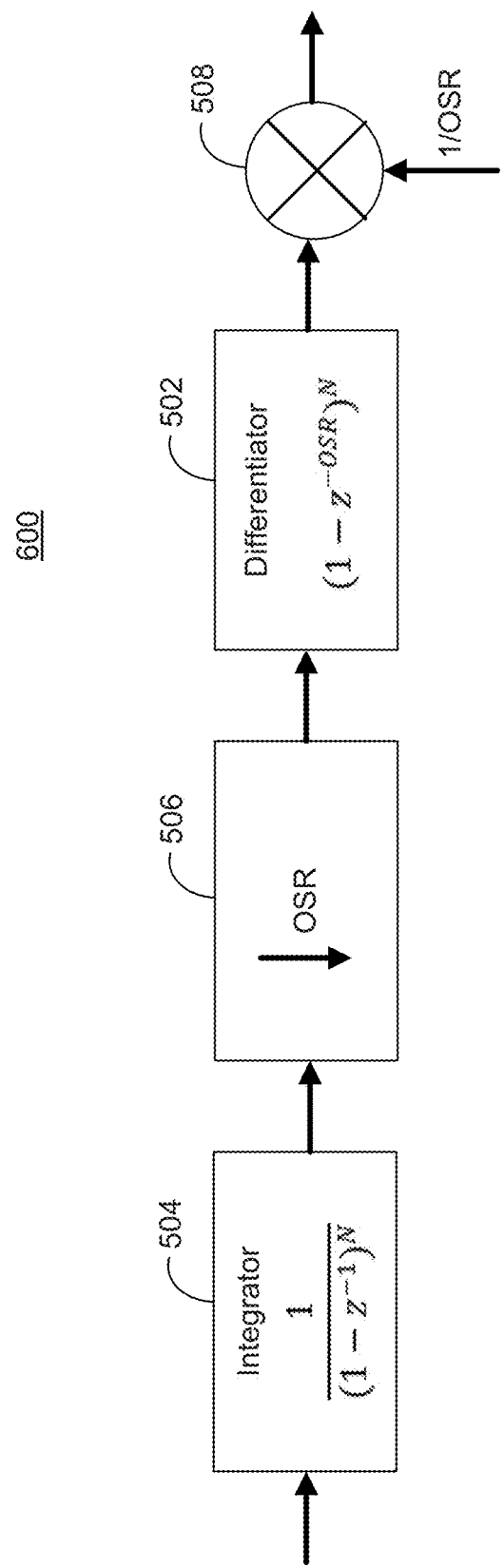
FIG. 6 illustrates an exemplary block diagram of a sinc filter with differentiation after decimation in accordance with an embodiment of the present invention.

As illustrated in FIG. 6, by switching the order of the differentiator 502 and integrator 504 and moving the decimator 506 to the left of the differentiator 502, a more efficient implementation may be derived. The exemplary sinc filter implementation, with the differentiator 502 after the decimator 506, requires OSR*N+N computations per output sample. However, this exemplary implementation may have instability issues. For example, a corresponding integrator transfer function has poles on the unit circle, and without cancelling the zeroes of the differentiator 502, the output of the integrator 504 may grow without bound. With a bit width that keeps increasing, an accumulator in the integrator 504 would need to be used that can roll over. Therefore, this exemplary implementation may be undesirable, especially for higher-order sinc decimation filters. It may sometimes be used for sinc2 or sinc3 implementations, provided the bit-width of the accumulator data path in the integrator 504 is sufficiently large.

Exemplary PDM Receiver Implementations:

In one exemplary embodiment, the sinc filter illustrated in FIG. 5, comprises a differentiator 502 implemented with a look-up table (LUT) as opposed to implementations of difference equations. Such an embodiment trades-off increased memory requirements of a look-up table for a reduction in the number of required computations. For example, if a LUT could be accessed in single-cycle, exemplary embodiments may only require OSR*N+N computations per output sample, a savings of approximately 50%.

Figure 7:
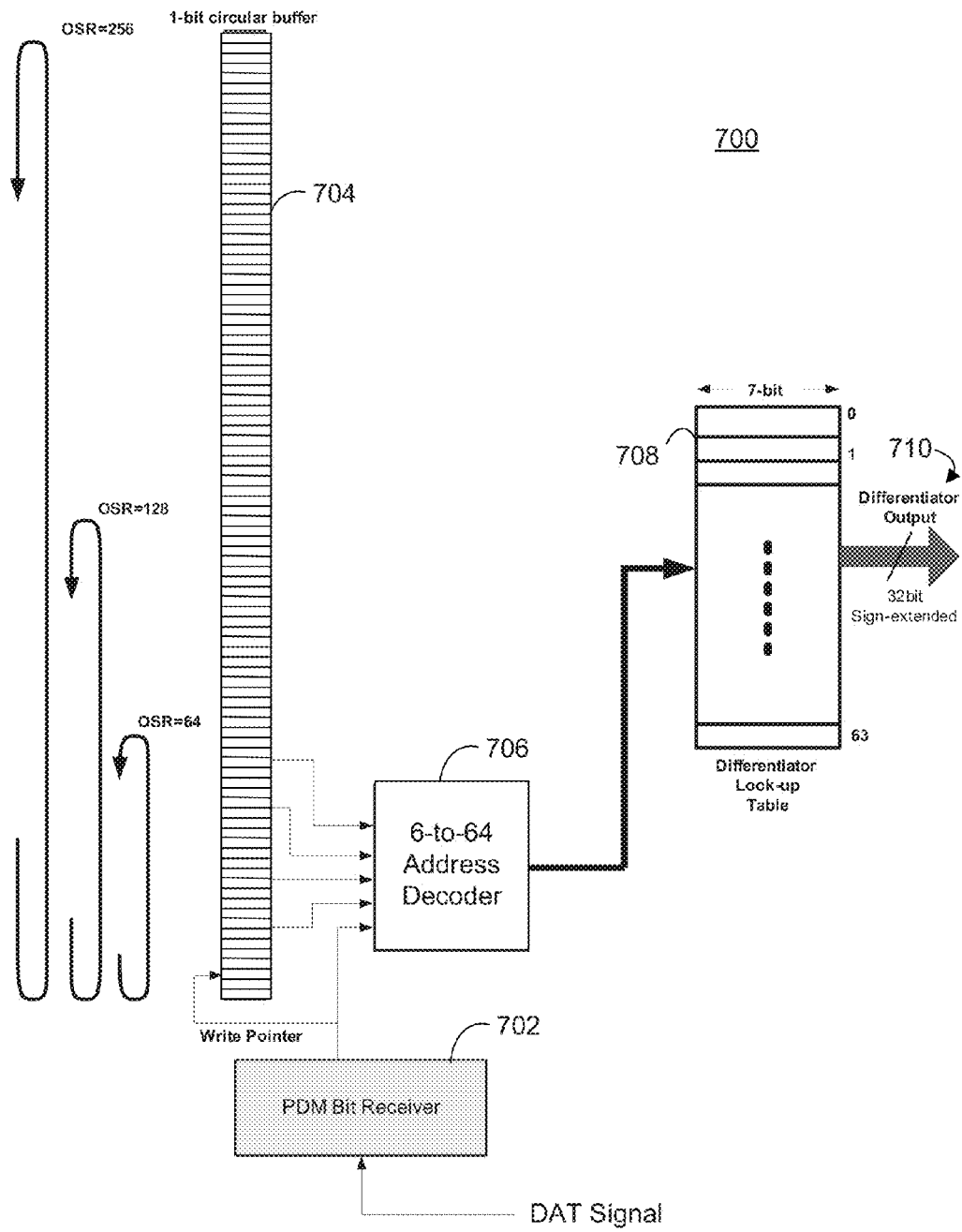
FIG. 7 illustrates an exemplary architecture block diagram of a sinc filter differentiator in accordance with an embodiment of the present invention.

FIG. 7 illustrates an exemplary simplified block diagram implementation of a sinc5 decimation filter's differentiator 502. As illustrated in FIG. 7, a bitstream (DAT signal) is received by a PDM bit receiver 702 and is placed into a 1-bit circular buffer 704. The circular buffer 704 may be referred to as a bit buffer or simply a buffer. In one embodiment, the size of the circular buffer 704 is dependent upon the oversampling ratio (OSR). In one exemplary embodiment, while FIG. 7 illustrates only a single OSR of bits in the circular buffer 704, the circular buffer 704 actually holds OSR*5 bits. In other words, when the bitstream has an OSR of 256, the circular buffer 704 will hold 1280 bits. As discussed herein, this allows the circular buffer 704 to hold the current sample (the most recent OSR bits) as well as the past four samples (with each sample comprising OSR bits). For example, in an exemplary embodiment where OSR=256, when a current sample of 256 bits is shifted into the circular buffer 704, the past four samples (of 256 bits each) are shifted up in the circular buffer 704 to make room for the current sample. As illustrated in FIG. 7, the output of the differentiator 502 implemented with a look-up table 708 generates an exemplary differentiator output 710 responsive to the bit values retrieved from the circular buffer 704 and passed to the look-up table 708 by the address decoder 706.

In one embodiment, the sinc5 decimation filter's integrator 504, illustrated in FIG. 5, may be implemented as a cascade of 5 first-order difference equations (illustrated below) using a MAC engine.

$$y1(n)=x(n)+y1(n-1)$$

$$y2(n)=y1(n)+y2(n-1)$$

$$y3(n)=y2(n)+y3(n-1)$$

$$y4(n)=y3(n)+y4(n-1)$$

$$y(n)=y4(n)+y(n-1)$$

The differentiator output is x(n) and the integrator output is y(n).

As discussed herein, an exemplary look-up table implementation (for the differentiator) requires one look-up table read operation and 5 accumulate operations per PDM input. In other words, 6 operations at a PDM input sample rate. For a 48 kHz sample rate and OSR=256, an exemplary PDM input sample rate may be 12.288 MHz. Thus, an exemplary clock requirement for such an approach may be 73.728 million operations per second. An exemplary memory requirement for this approach is 7*64 bits or 56 bytes for a differentiator look-up table. In addition, five more state variables for the integrator are needed. Since such an integrator consists of all-pole filters, with poles on the unit circle, the state variables may each grow to 64 bits in size. Therefore, the state variables require 5*64 bits or 40 bytes. Together, the exemplary differentiator and integrator need 96 bytes of storage, not including the 1-bit circular buffer, which in one embodiment requires 5*256 bits (where the buffer length will equal OSR*N).

Figure 8:
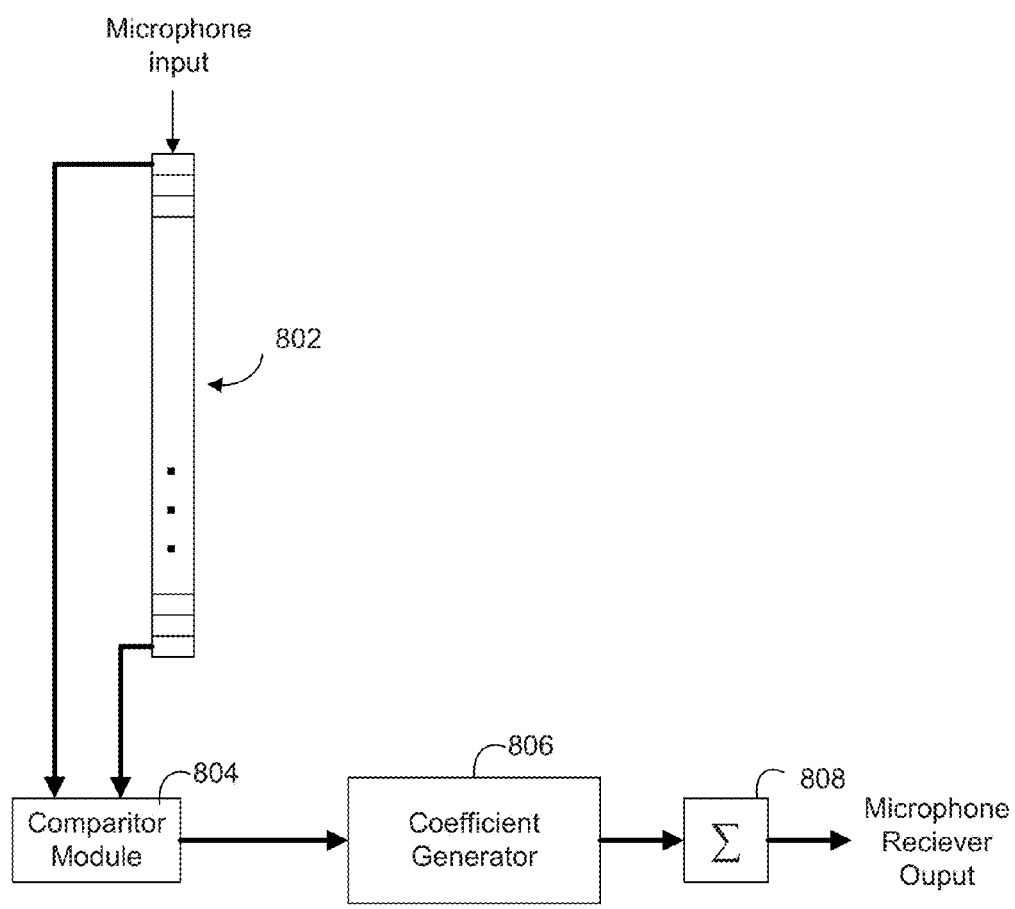
FIG. 8 illustrates a simplified block diagram of an exemplary FIR filter implementation in accordance with an embodiment of the present invention.

Memory Efficient SincN Filter Implemented as FIR Filter:

In a further exemplary embodiment, a SincN filter may be implemented as a finite impulse response (FIR) filter. Such a SincN filter implementation may realize a storage requirement reduction of up to 37.5%, which may lead to significant savings in die-size for a hardware implementation. As discussed herein, exemplary computations for a FIR filter implementation, illustrated in FIG. 8, do not require a table look-up operation, thus saving computations by 17%. Exemplary embodiments, as discussed herein, utilize a ring buffer 802 to store a bitstream for a plurality of samples. In one embodiment, the ring buffer 802 holds OSR*5 bits. As new samples are being shifted into the ring buffer 802, old samples are being pushed out. In one embodiment, a buffer may store a next sample, or the next sample may be stored in another portion of the ring buffer 802. As also illustrated in FIG. 8, bits from the ring buffer 802 are incrementally compared by a comparator module 804, and coefficients are generated by a coefficient generator 806. Such coefficients are selectively summed with a running sum of coefficients in a summation module 808.

In one embodiment, bits of a first half of a ring buffer 802 are incrementally compared to bits of a second half of the ring buffer 802. For example, in a ring buffer 802 with 1280 bits (for a ring buffer 802 holding five oversampled 1-bit bitstreams with an OSR=256), a first pair of compared bits comprises a first bit, n=0, compared to a last bit, n=1279, while a next pair of compared bits comprises a second bit, n=1, compared to a second-to-last bit, n=1278, etc.

The computations required have a time window of one output sample or OSR input samples. In one embodiment, before a full bitstream of a next sample has been loaded into the ring buffer 802, a current computation of a current bitstream of OSR input samples will have completed and the bitstream of the next sample will begin shifting into the ring buffer 802. Thus, the computations may be spread over a longer period of time, and the constraints for a clock frequency may be loosened, with the benefit of burst-processing when using a higher clock frequency. Since the filter computations are implemented as a FIR filter, it is inherently stable and the accumulator bit-widths may be determined ahead of time.

In one embodiment, the Sinc5 transfer function may be expanded to an all-zero transfer function instead of the traditional pole-zero form.

$$H(z) = \frac{1}{OSR}\left(\frac{1-Z^{-OSR}}{1-Z^{-1}}\right)^5$$

$$H(z) = \frac{1}{OSR}(1+z^{\wedge}(-1)+z^{\wedge}(-2)+\ldots+z^{\wedge}(-(OSR-1)))^5$$

The expression $(1+z^{\wedge}(-1)+z^{\wedge}(-2)+ \ldots +z^{\wedge}(-(OSR-1)))^5$ may be further expanded into a polynomial with 5*OSR-4 terms:

$$(1+z^{\wedge}(-1)+z^{\wedge}(-2)+\ldots+z^{\wedge}(-(OSR-1)))^5 = 1+5z^{-1}+15z^{-2}+35z^{-3}+$$

$$\ldots+35z^{-(5OSR-8)}+15z^{-(5OSR-7)}+5z^{-(5OSR-6)}+z^{-(5OSR-5)}.$$

Figure 9:
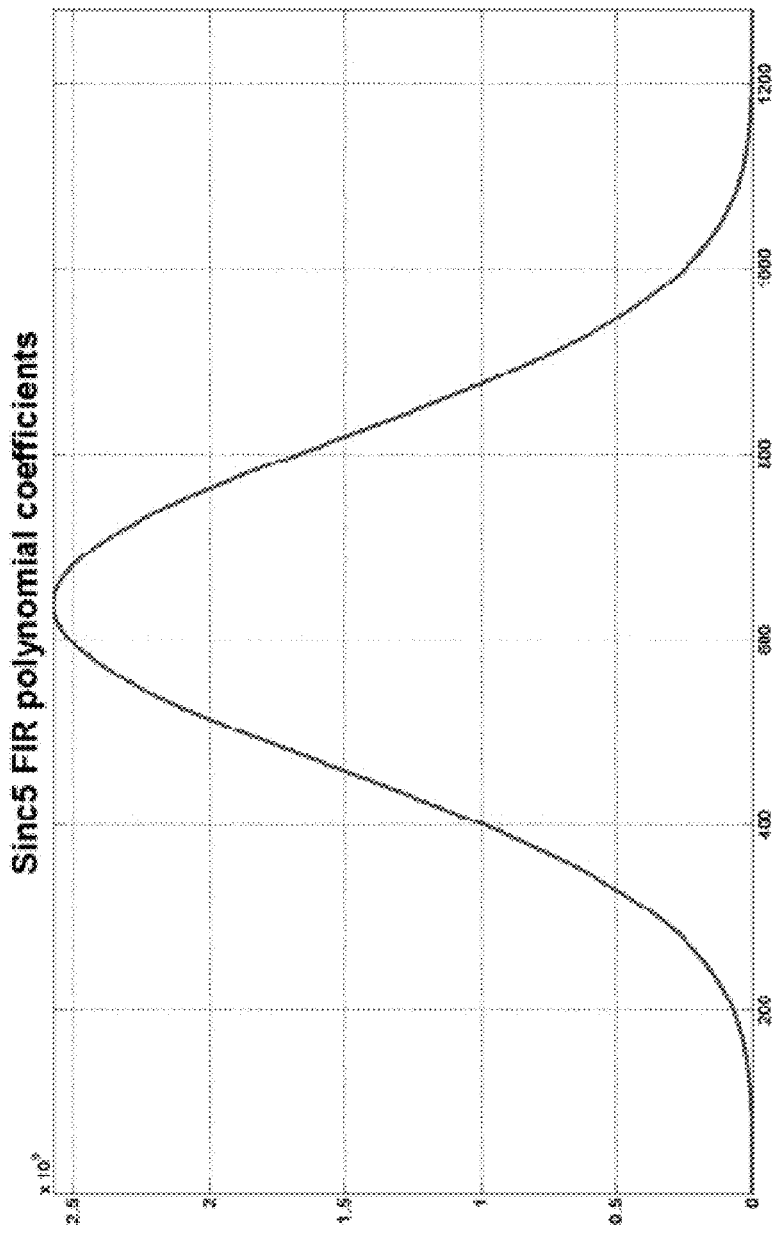
FIG. 9 illustrates exemplary sinc filter polynomial coefficients in accordance with an embodiment of the present invention.

FIG. 9 illustrates exemplary coefficients of the above polynomial for an OSR=256. As illustrated in FIG. 9, the polynomial coefficients are symmetric and always positive. One exemplary embodiment uses an on-the-fly computation of the Sinc5 polynomial coefficients. The lion's share of a current coefficient value is looking back. There is a delay involved (this is a low-pass filter). As discussed herein, most of the sample value is coming from coefficients calculated from the second OSR and part of the third OSR. Further, the symmetry may be exploited to only compute the coefficients of the Sinc5 polynomial that are needed. As noted herein, the coefficients may be all positive and symmetrical. For example, when a first bit in a ring buffer 704 is compared to a last bit in the ring buffer 704, and they are of opposite sign, their respective coefficients would cancel out and so the computations may be skipped. Such a computation utilizes a digital 1 represented as a +1, and a digital 0 represented as a −1. Exemplary coefficients of the Sinc5 polynomial may be described by the equations below:

$$h(n) = \begin{cases} \dfrac{a1(n+1)^4 + b1(n+1)^3 + c1(n+1)^2 + d1(n+1)}{24}, & \text{for } n = 0 \ldots, OSR-1; \\ \dfrac{a2(n+1)^4 + b2(n+1)^3 + c2(n+1)^2 + d2(n+1) + e2}{24}, & \text{for } n = OSR, lll, 2OSR-2; \\ \dfrac{a3(n+1)^4 + b3(n+1)^3 + c3(n+1)^2 + d3(n+1) + e3}{24}, & \text{for } n = 2OSR-1, \ldots, \dfrac{5OSR}{2}-3 \end{cases}$$

$h(n) = h(5OSR - 5 - n)$ for $n = \dfrac{5OSR}{2} - 2, \ldots, 5OSR - 5$

The values of coefficients may be derived as closed-form expressions in terms of OSR, as shown below.

TABLE 3

Sinc5 Polynomial Coefficients

| Coefficient | Expression | OSR = 64 | OSR = 128 | OSR = 256 |
|---|---|---|---|---|
| a1 | 1 | 1 | 1 | 1 |
| b1 | 6 | 6 | 6 | 6 |
| c1 | 11 | 11 | 11 | 11 |
| d1 | 6 | 6 | 6 | 6 |
| a2 | −4 | −4 | −4 | −4 |
| b2 | 20OSR − 24 | 1256 | 2536 | 5096 |
| c2 | $-30OSR^2 + 90OSR - 44$ | −117164 | −480044 | −1943084 |
| d2 | $20OSR^2 - 90OSR^3 - 55OSR^2 + 30OSR$ | 4881256 | 40482536 | 329674216 |
| e2 | $-5OSR^4 + 30OSR^3 - 55OSR^2 + 30OSR$ | −76245120 | −1280160000 | −20975116800 |
| a3 | 6 | 6 | 6 | 6 |
| b3 | −60OSR + 36 | −3804 | −7644 | −15324 |
| c3 | $210OSR^2 - 270OSR + 66$ | 842946 | 3406146 | 13693506 |
| d3 | $-300OSR3 + 630OSR^2 - 330OSR + 36$ | −76083804 | −618865884 | −4991961564 |
| e3 | $155OSR^4 - 450OSR^3 - 385OSR^2 - 90OSR$ | 2484074880 | 40670073600 | 658195392000 |

One exemplary process for computing an output sample from a PDM input bitstream is described below. These steps are repeated for every oversampled (OSR) 1-bit bitstream sample. In one exemplary embodiment, the steps listed below may be embodied as software and executed by a processor.

1. n = 1.
2. Output = 0.
3. Collect new OSR input 1-bit samples and shift them into the input bit-buffer.
   Bitbuffer[k] = bitbuffer[k-OSR], for k = OSR,..., 5OSR − 5.
   Bitbuffer[0:OSR-1] = new samples, with Bitbuffer[0] the latest input bit.
4. Left_index = n−1, right_index = 5OSR − 4 − n.
5. If(XOR(Bitbuffer[left_index], bitbuffer[right_index] == 1) goto step 8.
6. If(n <= OSR)
      Compute Partial_output = ((((a1 * n + b1)*n + c1) *n + d1) *n).
   Else if(n<= 2OSR-1)
      Compute Partial_output = ((((a2 * n + b2)*n + c2) *n + d2) *n) + e2.
   Else if(n<=5OSR/2 − 2)
      a. Compute Partial_output = ((((a3 * n + b3)*n + c3) *n + d3) *n) + e3.
   Else goto step 10.
7. If(Bitbuffer[left_index] == 0)
      Output = Output + Partial_output
   Else
      Output = Output − Partial output -continued 8. n = n+1.
9. Goto step 4.
10. Output = Output/12.

The above process requires four multiply-accumulate operations for every pair of input PDM input samples for which the partial_output is computed. In addition, the computation is carried out only when the pair of left_index and right_index bits are of the same sign (+1 or −1). Thus, for a DC average input signal, as is the case in a typical audio signal, the computation may only be carried out half the time on average. When the compared bits are of opposite signs (e.g., a +1 and a −1), no computation is carried out, but when the compared bits are of the same sign (e.g., a +1 and a +1, or a −1 and a −1), their coefficient is calculated and summed to a running total (also known as a partial sum of coefficients). Therefore, in one embodiment, an exemplary total number of computations required with this process is on average equal to 4*(5OSR/2−2)/2 or 5OSR-4 computations. A first left-hand sample in the ring buffer 802 is N=0, while a last left-hand sample in the middle of the ring buffer 802 is N=(5*OSR/2)−2.

As discussed herein, and illustrated in FIG. 9, each computation of a coefficient is based upon a bit position of a current OSR sample bit, such that coefficients for a first, a second, and half of a third OSR of bits in the ring buffer 802 are calculated (if the bit signs match). As illustrated in FIG. 9, since the opposite coefficient value would be of an equal amplitude, a single coefficient computation may be multiplied by 2, rather than computing the second coefficient as well. As also discussed herein, the summed coefficients may be rounded to a desired bit width (e.g., 16, 24, 32 bits). The output may be encoded such that a maximum possible summed coefficient value fits into a buffer, e.g., a 32 bit buffer. Should an output less than, for example, 32 bits, be desired, the most significant bits may be selected and passed on as the audio signal.

As demonstrated in Table 4, illustrated below, the number of computations required can be estimated as a function of an input signal level. As illustrated in Table 4, a typical input signal level for speech communications and audio recordings may be −26 dBFS nominal, with a variation of +/−10 dB. Thus, for common recording signal levels, the above described computations may only need to be carried out half of the time.

TABLE 4

Computation Requirements as a Function of Input Signal Level

| Signal Level (dBFS) | % of bits that need coefficient calculations |
|---|---|
| −90 | 36.6 |
| −60 | 38.49 |
| −45 | 50.89 |
| −30 | 49.41 |
| −24 | 49.53 |
| −18 | 50.14 |
| −12 | 52.43 |
| −9 | 55.46 |
| −6 | 61.60 |

In addition, for really low level signals, for example, −60 dBFS (0.001 V versus a 1.0 V positive maximum value), exemplary embodiments may provide an important advantage in terms of power consumption. Especially for new generations of applications where digital microphones need to be always on and monitoring the levels of a PDM input signal. During this always-on signal processing, the above described exemplary process may perform much fewer computations (when a signal level is low, close to half of the bits will be 1's and 0's, allowing a majority of them to be cancelled out) and consume much less power as compared to a conventional process. By utilizing a process where the quantity of computations performed are proportional to the signal level provides a large savings in battery power consumption and increased stand-by time for the device. With fewer calculations and computations, a clock rate may be reduced with an accompanying reduction in energy cost.

When this process (implemented as a FIR filter) is compared to the previous embodiment utilizing a look-up table followed by an integrator, this exemplary process saves on the differentiator look-up table operation, and reduces computations to 5OSR-4 computations as opposed to 6OSR computations. This means that for an OSR=256, and a sample rate of 48 kHz, the previously required clock frequency requirements may be reduced to an exemplary 621.248 MHz, as opposed to the conventional 73.728 MHz. In addition, since the computations are completely feed-forward, the computations may be pipe-lined which may result in further clock requirement reductions. Further, as there is no need for a look-up table or for state information of the integrator, the memory requirements may be reduced by an exemplary 96 bytes.

Figure 10:
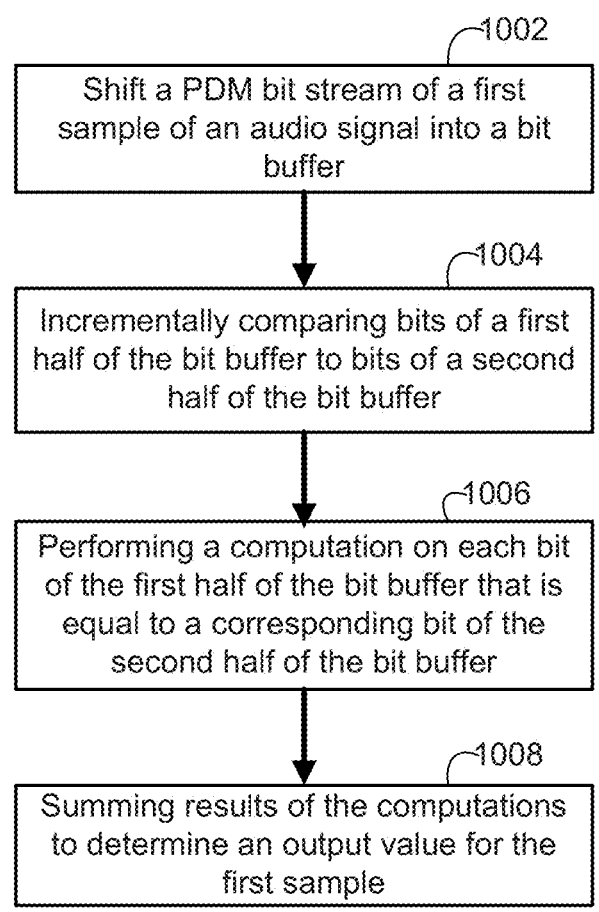
FIG. 10 illustrates a flow diagram, illustrating the steps to a method in accordance with an embodiment of the present invention.

FIG. 10 illustrates a simplified, exemplary process for decoding a pulse density modulated (PDM) 1-bit bitstream of a sample of an audio signal. As discussed herein, samples of an audio signal are encoded by pulse density modulation so that each sample is represented by a 1-bit bitstream that may be oversampled with an oversampled ratio (OSR) of for example, 64, 128, 256, etc.

In step 1002 of FIG. 10, a PDM bitstream of a first sample of the audio signal is shifted into a bit buffer. In one embodiment, the bit buffer is a 1-bit circular buffer that is large enough to contain the bitstreams of five samples of the audio signal for processing. In step 1004 of FIG. 10, bits of a first half of the bit buffer are incrementally compared to bits of a second half of the bit buffer. In one embodiment, the comparison is performed with an XOR operation, such that if the compared bits are unequal (e.g., +1 and −1), the output is 1, while if the compared bits are equal, the output is 0 (e.g., +1 and +1, and −1 and −1). As discussed herein, a digital 1 may be represented by a +1, while a digital 0 may be represented by a −1. Bit values are compared and coefficient computations are only carried out when the bit values are of matching signs (when the pair of values are of opposite sign, their corresponding computations would cancel each other out, so they may be ignored).

In step 1006 of FIG. 10, a coefficient computation is performed for each bit of the first half of the bit buffer that is equal to a corresponding bit of the second half of the bit buffer. In one embodiment, the coefficient computation is a combination of multiplicative and additive operations, as discussed above, that changes depending on which bitstream of the first half of the bit buffer is being compared. In one exemplary embodiment, for each computed coefficient computation there will be four multiply accumulates and a summation. In one exemplary embodiment, the coefficient computations may result in a coefficient arrangement as illustrated in FIG. 9. In step 1008 of FIG. 10, results of the coefficient computations are summed to determine an output value for the first sample. As discussed herein, these steps are repeated for each sample of the audio signal to recover the original audio signal.

Figure 11:
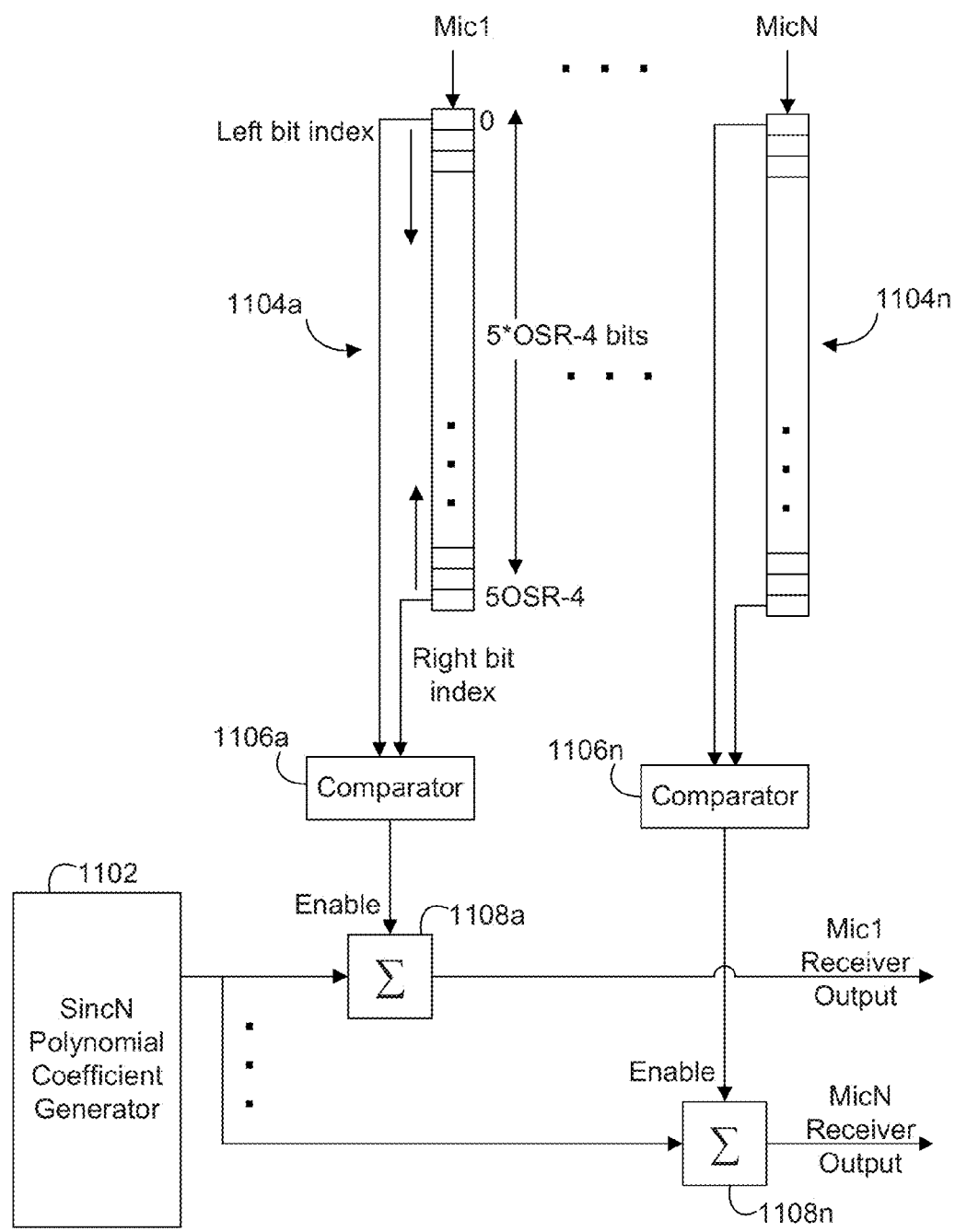
FIG. 11 illustrates a simplified block diagram of a plurality of exemplary digital microphone receivers using a single coefficient generator in accordance with an embodiment of the present invention.

Computational Efficiency for Multiple Digital Microphones:

In one exemplary embodiment illustrated in FIG. 11, an efficient process may be utilized when receiving more than one PDM channel or digital microphone signal. An exemplary SincN polynomial coefficient generation logic block 1102, illustrated in FIG. 11, is shared across all microphones (Mic1 . . . MicN) that operate at a same sample rate and oversampling ratio. The SincN polynomial generator 1102 is also illustrated in detail in FIG. 12. As also illustrated in FIG. 11, and discussed herein, each microphone (Mic1-MicN) has a ring buffer 1104a-1104n, an individual comparator module 1106a-1106n, and a summation module 1108a-1108n that holds a running sum of coefficients generated by the coefficient generator 1102. A given coefficient (from the coefficient generator 1102) for a given bit in a ring buffer 1104a-1104n will only be summed with a current running sum when an enable signal from a corresponding comparator module 1106a-1106n is received by the corresponding summation module 1108a-1108n, indicating that the signs of the compared bits are the same (and that the coefficients for the two compared bits would not cancel out).

Figure 12:
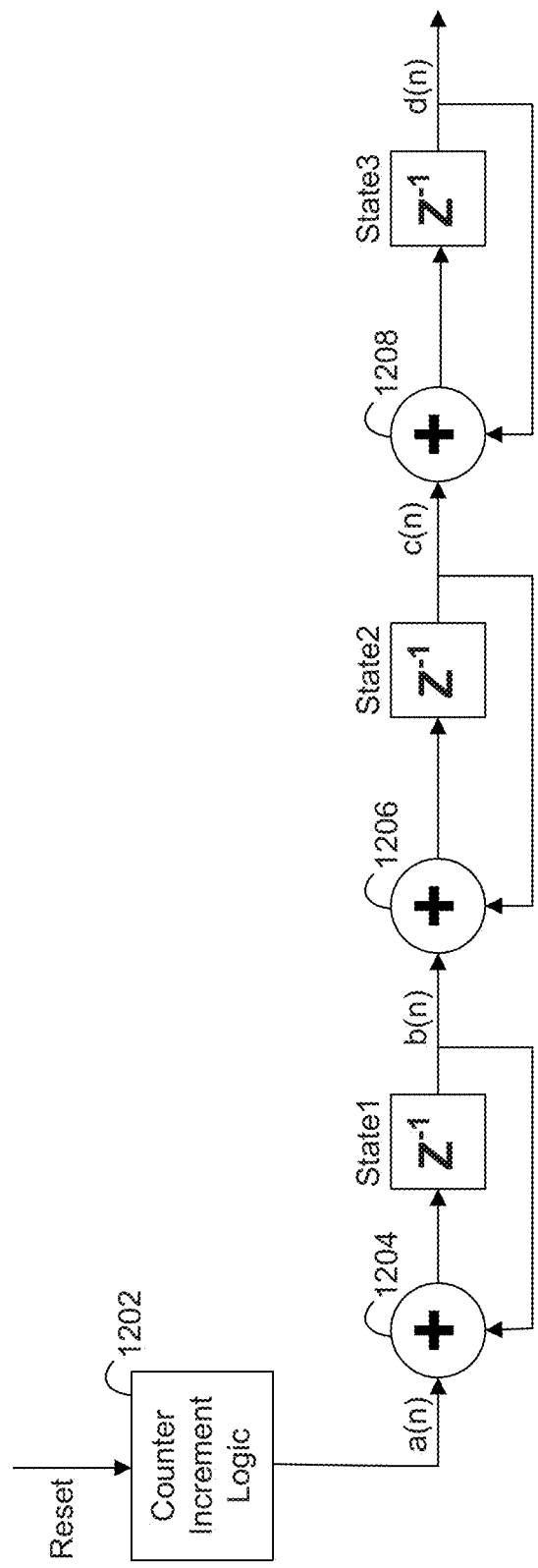
FIG. 12 illustrates a simplified block diagram of an exemplary coefficient generator, in accordance with an embodiment of the present invention.

As illustrated in FIG. 12, an exemplary Sinc5 polynomial coefficient generation logic requires three adders (1204, 1206, and 1208) and three state variable storage elements (State1, State 2, and State3). Exemplary counter increment logic 1202 is described by the logic below and is repeated for every oversampled 1-bit bitstream sample. As illustrated in FIG. 12, rather than the equations discussed above, the coefficient generator 1102 makes use of a simplified integrator. As the signals (a(n), b(n), c(n), and d(n)) traverse from beginning to end, as illustrated in FIG. 12, the coefficient values output from the coefficient generator 1102 are supplied but only summed by the individual summation modules 1108a-1108n when they receive the enable signals. In other words, the coefficient generator 1102 incrementally computes all of the coefficients to be used for all the microphone inputs Mic1-MicN, such that they only need to be computed once for them all (the generator logic is shared across all the microphones Mic1-MicN). Therefore, if a value input to the summation module 1108a-1108n is a bit value equal to a digital 0, the computation will comprise −2*the computed coefficient value, while if the bit value is equal to a digital 1, the computation will comprise +2*the computed coefficient value. At every clock cycle, a new coefficient value is being generated and supplied to the summation modules 1108a-1108n, and with every clock cycle the generated coefficient is either added, subtracted, or ignored, as determined by the enable signals received from corresponding comparator modules 1106a-1106n.

In one exemplary embodiment, the following four-part process is carried out by the coefficient generator 1102, as illustrated in FIG. 12.

(1). At reset, which happens after every OSR input bits are shifted in the circular bit buffer, initialize a(0)=4, state1=b(0)=6, state2=c(0)=4, state3=d(0)=1.

(2). For n=1, . . . , OSR-4, increment a(n) and calculate b(n), c(n), and d(n).

$$a(n)=a(n-1)+1$$

$$b(n)=a(n-1)+b(n-1)$$

$$c(n)=b(n-1)+c(n-1)$$

$$d(n)=c(n-1)+d(n-1)$$

(3). For n=OSR-3, . . . , 2OSR-3, decrement a(n) by 4 and calculate b(n), c(n), and d(n).

$$a(n)=a(n-1)-4$$

$$b(n)=a(n-1)+b(n-1)$$

$$c(n)=b(n-1)+c(n-1)$$

$$d(n)=c(n-1)+d(n-1)$$

(4). For n=2OSR-2, . . . , 5OSR/2-3, decrement a(n) by 4 and calculate b(n), c(n), and d(n).

$$a(n)=a(n-1)+6$$

$$b(n)=a(n-1)+b(n-1)$$

$$c(n)=b(n-1)+c(n-1)$$

$$d(n)=c(n-1)+d(n-1)$$

Figure 13:
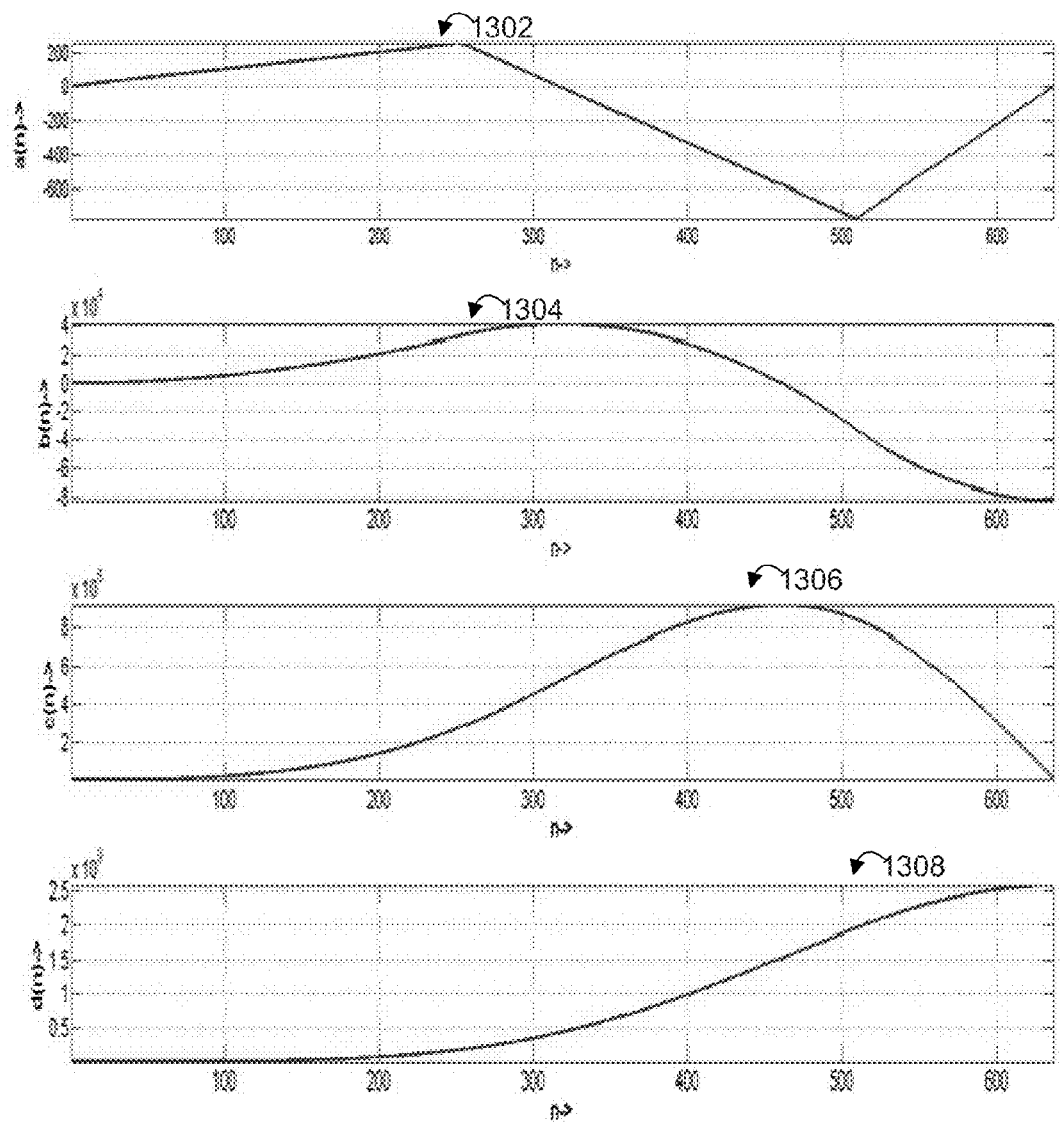
FIG. 13 illustrates a plurality of signal diagrams of exemplary signals a(n), b(n), c(n), and d(n) of the coefficient generator of FIG. 11 in accordance with an embodiment of the present invention.

FIG. 13 illustrates exemplary signals a(n), b(n), c(n), and d(n). The amplitude range of input signal a(n) to a first adder 1204 is between +OSR and −3OSR, and may be represented in log 2(OSR)+3 bits or 11 bits for a maximum OSR of 256. The amplitude range of signal b(n) is [−(5/4)OSR$^2$, (5/8) OSR$^2$] and needs 2 log 2(OSR)+2 bits or 18 bits for a maximum OSR of 256. Similarly the range of signal c(n) is 3*log 2(OSR)+1 bits or 25 bits for a maximum OSR of 256. Finally the range of d(n) signal can be represented using 5*OSR bits or 40 bits for a maximum OSR of 256. Therefore, the state storage requirements are 18+25+40 bits or less than 12 bytes or 3 long (32-bit) words. This is a very small area and is independent of the number of signals (digital microphone signals and PDM signals). Therefore, as the number of digital microphones increases, the amount of memory storage does not have to increase.

In terms of computations, the Sinc5 polynomial coefficient generation requires (5OSR/2-3)*3 MAC computations per microphone output sample. The final summing per microphone output only needs to run 50% of the time for nominal input level signals. Thus the total number of computations required is (5OSR/2-3)*3+(5OSR/2-3)*0.5*N. Here N is the number of microphones. The following table shows the number of computations required for a multi-microphone PDM receiver.

| Number of microphones | MAC computations for conventional process, per output sample: | | | MAC computations for exemplary process, per output sample: | | |
| --- | --- | --- | --- | --- | --- | --- |
|  | OSR = 64 | OSR = 128 | OSR = 256 | OSR = 64 | OSR = 128 | OSR = 256 |
| 1 | 384 | 768 | 1536 | 549.5 | 1099 | 2198 |
| 2 | 768 | 1536 | 3072 | 628 | 1256 | 2512 |
| 3 | 1152 | 2304 | 4608 | 706.5 | 1413 | 2826 |
| 4 | 1536 | 3072 | 6144 | 785 | 1570 | 3140 |
| 5 | 1920 | 3840 | 7680 | 863.5 | 1727 | 3454 |
| 6 | 2304 | 4608 | 9216 | 942 | 1884 | 3768 |
| 7 | 2688 | 5376 | 10752 | 1020.5 | 2041 | 4081 |
| 8 | 3072 | 6144 | 12288 | 1099 | 2198 | 4396 |

Figure 14:
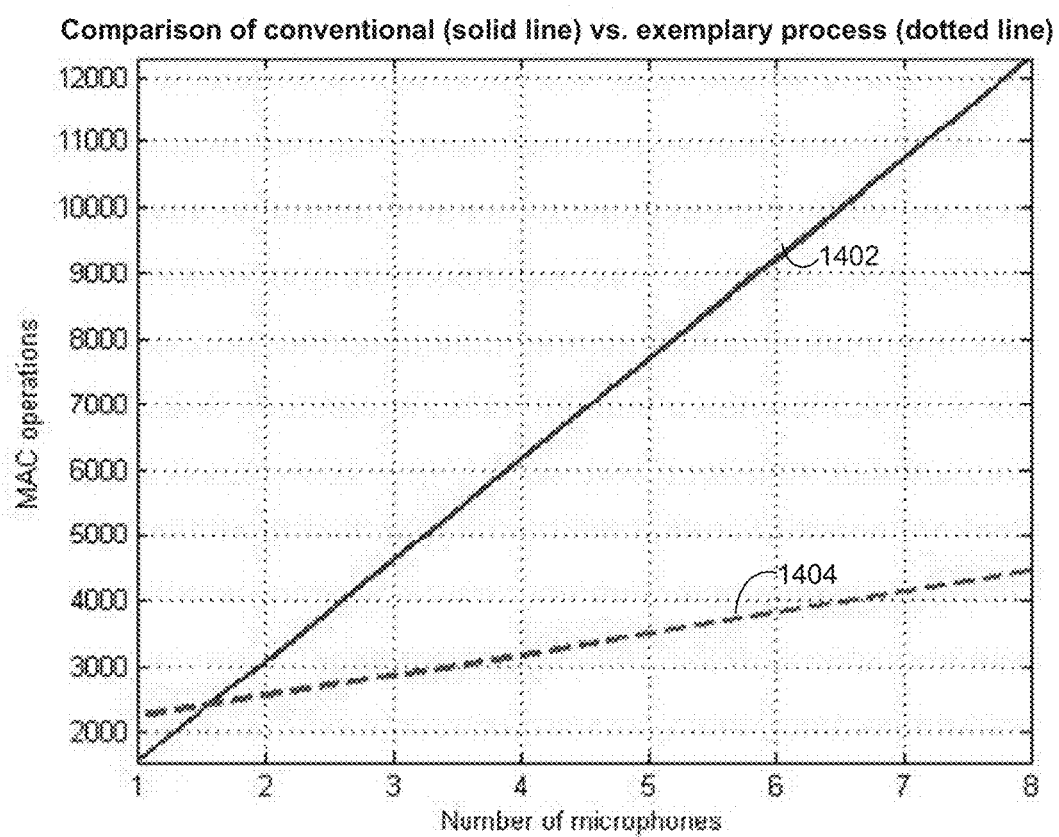
FIG. 14 illustrates an exemplary comparison of a number of operations needed for a plurality of conventional microphone receivers versus a plurality of microphone receivers in accordance with an embodiment of the present invention.

Clearly, as the number of microphones increases, the quantity of computations required for the exemplary process increases much more slowly compared to the conventional process. The calculation of the coefficients, according to the exemplary process, is amortized across all the microphones Mic1-MicN. The same idea is depicted in the graph illustrated in FIG. 14. The exemplary process outperforms the conventional process whenever a pair of microphones (stereo capture) or more is needed. For example, when there are eight microphone inputs, rather than having to calculate the coefficient eight times, the coefficient only needs to be calculated once and shared by all eight microphones. So at worse, there might be a situation where none of the microphones need a particular computed coefficient (where all compared bits are of opposite sign), but there will be many more situations where more than one microphone will need a currently computed coefficient. Thus, as illustrated in FIG. 14, the more microphones there are, the more the computational savings increase, while following conventional embodiments, the computational complexity would increase linearly as the number of microphones increases.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for signal processing, the method comprising:
   sampling a signal received from a microphone;
   shifting a bitstream of a first sample of the signal into a buffer, wherein the buffer also stores bits of one or more additional bitstreams for one or more additional samples of the signal;

incrementally comparing bits of a first half of the buffer to corresponding bits of a second half of the buffer, wherein each bit of the first half of the buffer is compared to a corresponding bit of the second half of the buffer;

performing a computation on each bit of the first half of the buffer that is equal to a corresponding bit of the second half of the buffer; and summing the results of the computations to determine an output value for the first sample of the signal.

2. The method of claim 1, wherein the bitstream is an oversampled pulse density modulated (PDM) 1-bit bitstream, and wherein said signal is an audio signal.

3. The method of claim 1, wherein the comparing comprises performing an exclusive OR logical operation.

4. The method of claim 1, wherein the processing the bitstream is implemented with a finite impulse response (FIR) filter.

5. The method of claim 1, wherein each computation comprises performing four multiply-accumulate operations.

6. The method of claim 1, wherein the comparing and the computing are completed before bits of a next bitstream are shifted into the buffer.

7. The method of claim 1, wherein a processor performing the comparing and the computing is idle after the comparing and the computing are completed and before bits of a next bitstream are shifted into the buffer.

8. The method of claim 1, wherein the signal is an audio signal.

9. The method of claim 1, wherein during periods of time when the bitstream is approximately a DC average signal, the performing a computation is performed on less than half of the bits of the first half of the buffer.

10. The method of claim 1, wherein the buffer is filled with bits of four additional bitstreams for four additional samples of the signal.

11. An audio system comprising:
an audio input device configured to receive audio signals;
a sampling device configured to sample the audio signals;
a processor; and memory coupled to the processor and storing instructions that, when executed by the processor, implement:
a plurality of buffers each operable to store bitstreams of a plurality of samples of corresponding audio signals, wherein a first buffer holds bitstreams of a plurality of samples of a first audio signal;
a coefficient generator operable to incrementally generate a plurality of coefficients;
a plurality of comparators each coupled to a corresponding buffer, the comparators each operable to incrementally compare bits of a first half of a corresponding buffer to corresponding bits of a second half of the corresponding buffer and output an enable signal when a bit of the first half of the corresponding buffer is equal to a corresponding bit of the second half of the corresponding buffer; and
a plurality of summation modules each coupled to the coefficient generator and to a corresponding comparator of the plurality of comparators and each operable to receive and sum a currently generated coefficient of the plurality of coefficients with a running sum of coefficients when an enable signal is received from the corresponding comparator, wherein each summed plurality of coefficients is an output value for a sample of a corresponding audio signal.

12. The audio system of claim 11, wherein the coefficient generator is synchronized with the plurality of comparators, and wherein each incrementally generated coefficient received by the plurality of summation modules corresponds with bits currently being compared by each of the plurality of comparators.

13. The audio system of claim 11, wherein a bitstream of a sample of an audio signal comprises an oversampled pulse density modulated (PDM) bitstream.

14. The audio system of claim 11, wherein a running sum of coefficients of a first summation module of the plurality of summation modules comprises a sum of coefficients received by the first summation module when an enable signal from a first comparator of the plurality of comparators is being generated.

15. The audio system of claim 11, wherein each buffer is operable to hold bitstreams of five samples of a corresponding audio signal.

16. The audio system of claim 11, wherein a comparator of the plurality of comparators is operable to perform an exclusive OR logical operation.

17. The audio system of claim 11, wherein a coefficient is generated for each pair of compared bits.

18. The audio system of claim 11, wherein a summation module of the plurality of summation modules is further operable to multiply a currently received coefficient by +1 or −1 before summing with a running sum of coefficients as defined by a sign of the bits compared by a corresponding comparator, and wherein a digital 0 is considered a −1 and a digital 1 is considered a +1.

19. An audio system comprising:
means for sampling an audio signal received from an audio input device;
means for shifting a bitstream of a first sample of the audio signal into a buffer, wherein the buffer also stores bits of one or more additional bitstreams for one or more additional samples of the audio signal;
means for incrementally comparing bits of a first half of the buffer to corresponding bits of a second half of the buffer, wherein each bit of the first half of the buffer is compared to a corresponding bit of the second half of the buffer;
means for performing a computation on each bit of the first half of the buffer that is equal to a corresponding bit of the second half of the buffer; and
means for summing the results of the computations to determine an output value for the first sample of the audio signal.

20. The audio system of claim 19, wherein the means for incrementally comparing bits and the means for performing a computation are idle after the comparing and computing are completed and before bits of a next bitstream of a next sample of an audio signal are shifted into the buffer.

* * * * *